(12) United States Patent
Davoine et al.

(10) Patent No.: US 8,586,409 B2
(45) Date of Patent: Nov. 19, 2013

(54) COMPONENT WITH BURIED DUCTILE CONDUCTIVE BUMPS AND METHOD OF ELECTRICAL CONNECTION BETWEEN SAID COMPONENT AND A COMPONENT EQUIPPED WITH HARD CONDUCTIVE POINTS

(75) Inventors: Cécile Davoine, Le Havre (FR); Manuel Fendler, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 198 days.

(21) Appl. No.: 11/662,940

(22) PCT Filed: Sep. 29, 2005

(86) PCT No.: PCT/FR2005/050795
§ 371 (c)(1),
(2), (4) Date: Jan. 7, 2008

(87) PCT Pub. No.: WO2006/054005
PCT Pub. Date: May 26, 2006

(65) Prior Publication Data
US 2008/0190655 A1  Aug. 14, 2008

(30) Foreign Application Priority Data
Oct. 4, 2004  (FR) .................................... 04 52249

(51) Int. Cl.
*H01L 21/00* (2006.01)
(52) U.S. Cl.
USPC .......................................... 438/107; 438/613

(58) Field of Classification Search
USPC .................................. 257/778; 438/107, 613
See application file for complete search history.

(56) References Cited

U.S. PATENT DOCUMENTS

| 5,929,521 | A | * | 7/1999 | Wark et al. .................... 257/737 |
|---|---|---|---|---|
| 6,179,198 | B1 | * | 1/2001 | Eifuku et al. .............. 228/180.22 |
| 6,236,112 | B1 | * | 5/2001 | Horiuchi et al. ................ 257/734 |
| 6,362,087 | B1 | * | 3/2002 | Wang et al. .................... 438/597 |
| 6,387,747 | B1 | * | 5/2002 | Cha et al. ....................... 438/238 |
| 6,414,506 | B2 | * | 7/2002 | Akram et al. .................. 324/765 |
| 2001/0020549 | A1 | * | 9/2001 | Horiuchi et al. ............... 174/263 |
| 2002/0129894 | A1 | * | 9/2002 | Liu et al. ........................ 156/291 |
| 2002/0153608 | A1 | * | 10/2002 | Okada et al. ................... 257/737 |
| 2003/0151140 | A1 | * | 8/2003 | Nishiyama et al. ........... 257/737 |
| 2003/0234277 | A1 | * | 12/2003 | Dias et al. ................ 228/180.22 |

FOREIGN PATENT DOCUMENTS

WO   2004093266 A1   10/2004

* cited by examiner

*Primary Examiner* — Kimberly Rizkallah
*Assistant Examiner* — Duy T Nguyen
(74) *Attorney, Agent, or Firm* — Nixon Peabody LLP

(57) ABSTRACT

A method of electrical connection between a series of hard conductive points and corresponding pads arranged on a one face of a first component, and a series of buried ductile conductive bumps and corresponding pads arranged on one face of a second component. The method comprises forming said series of hard conductive points on said face of the first component; forming said series of buried ductile conducting bumps on said face of the second component; inserting said series of hard conductive points in said series of buried ductile conducting bumps at an ambient temperature; and directly sealing the first and second components together.

8 Claims, 6 Drawing Sheets

COMPONENT WITH BURIED DUCTILE CONDUCTIVE BUMPS AND METHOD OF ELECTRICAL CONNECTION BETWEEN SAID COMPONENT AND A COMPONENT EQUIPPED WITH HARD CONDUCTIVE POINTS

CROSS REFERENCE TO RELATED APPLICATIONS OR PRIORITY CLAIM

This application is a national phase of International Application No. PCT/FR2005/050795 entitled "Component With Buried Ductile Conductive Bumps And Method For Electric Connection Between Said Component And A Component Provided With Hard Conductive Tips", which was filed on Sep. 29, 2005, which was not published in English, and which claims priority of the French Patent Application Nos. 04 52249filed Oct. 4, 2004.

TECHNICAL FIELD

The present invention concerns a component with buried ductile conductive bumps and a method of electrical connection between said component and a component equipped with hard conductive points.

STATE OF THE PRIOR ART

In the connector technology field using the "flip chip" technique, the present trend is the reduction of the "pitch", in other words the distance between the interconnections connecting chip and substrate. In such a technique a substrate has all the contacts, in the form of bumps or metallic bumps, located on a single face. The chip is flipped over so that the bumps can be soldered to appropriate conductors on said chip. However, conventional hybridisation methods such as the soldering of bumps or the thermo-compression of pads, as well as more recent methods such as ACF ("Anisotropic Conductive Films") or the use of conductive polymers show their limits in terms of pitch reduction.

The formation of electrical connections by insertion of micro-points or hard conductive "points" in the ductile conductive bumps appears to be a solution compatible with such a reduction of the pitch in so far as it is "flux free", requires a low mechanical pressure and enables any deflections of the chip or the substrate to be put right.

U.S. Pat. No. 6,179,198 describes, for instance, a method of connection by insertion of a first part equipped with several points with a second part equipped with pads crowned by soldering bumps without using flux. This method comprises the steps consisting in aspirating under vacuum the first part, pressing at least one point of the first part against a pad of the second part, piercing by means of said point the native oxide crust on the surface of the soldering bump by heating above the melting temperature of the material constituting the bump, cooling, and solidifying the melted soldering bump. The surface of the soldering bump is, in fact, coated by a film in oxide such as a hard coating, in such a way that, even if the point is pressed firmly against the soldering bump by heating above the melting temperature of the material constituting the bump, the soldering does not flow onto the side, and there is no production of a soldering bridge. The mechanical holding is assured by the soldering. However, at low pitch, it is necessary to protect the connections from mechanical shearing due to the difference in thermal expansion coefficient by a coating.

The principal advantage of such a method of electrical connection by insertion is to be able to do without flux, unlike conventional hybridisation methods (soldering of bumps and thermo-compression) that call on the use of a chemical attack solution, the flux, making it possible to eliminate the layer of native oxide on the surface of the alloy. In these methods the step of rinsing of the flux is awkward to carry out at low pitch. Flux residues act, in fact, as an obstacle to the propagation of the coating adhesive serving to protect the beads during the thinning steps or during the use of the hot or cold device by reinforcing the thermomechanical coupling between the chip and the substrate, which leads to the presence of bubbles that are harmful to stacking from a thermomechanical point of view.

Thus, in this method of the prior art, as illustrated schematically in FIG. 1, one forms a connection between the pads 6 of a first component 17 and the pads 7 of a second component 19, for example a substrate, by insertion of a series of hard conductive points 16 arranged on one face of this first component 17 in a series of ductile conductive bumps 18 arranged on one face of the second component 19, each point 16 of the first component 17 corresponding to a bump 18 of the second component 19. The mechanical holding is assured by a coating adhesive 15.

The aim of the invention is to enable a direct sealing between components by eliminating the coating step, difficult at low pitch.

DESCRIPTION OF THE INVENTION

The present invention concerns a method of electrical connection between a first component comprising, on one face, a series of first pads and a series of hard conductive points and a second component comprising, on one face, a series of seconds pads and a series of ductile conductive bumps, in which one places opposite each other the two faces and one brings them together in such a way that the points can penetrate into said bumps, characterised in that the bumps are buried.

Advantageously the mechanical holding between the two components is assured by bonding at the interface between the components, between the bumps, for example by sealing by molecular adhesion carried out at ambient temperature by means of a plasma passivation or by an adhesive.

One thereby forms the electrical connections at a topological level different to that of the mechanical contact. The coating that served to mechanically protect the connections is no longer necessary.

In one embodiment, the bumps are obtained by electrolytic growth or deposition at the base of cavities formed in a passivation layer or by etching.

In another embodiment, the points are obtained by metallic deposition, etching, electrolytic growth, metallic nanoprinting, or growth of aligned nanotubes.

The invention further concerns a component comprising, on one face, a series of pads and a series of ductile conductive bumps capable of being electrically connected to another component equipped, on one face, with a series of pads and a series of hard conductive points, characterised in that the bumps are buried.

Each bump is in electric conductor material such as for example a soldering paste or a conductive adhesive.

Each point may be in metal, more generally in conductor material. Each point may also be a nanotube or a nanowire.

By burying the bumps in a component (for example a substrate or a chip), one separates the level of connections from that of mechanical holding. This novel hybridisation concept renders compatible the technique of insertion and direct transfer of one component onto the other, and thereby makes it possible to eliminate the coating step, difficult from a technological point of view at low pitch. It offers the advantage of being at ambient temperature, "flux free" because the point pierces the native oxide crust on the surface of a bump, and requires a low mechanical pressure.

DETAILED DESCRIPTION OF SPECIFIC EMBODIMENTS

Figure 1:
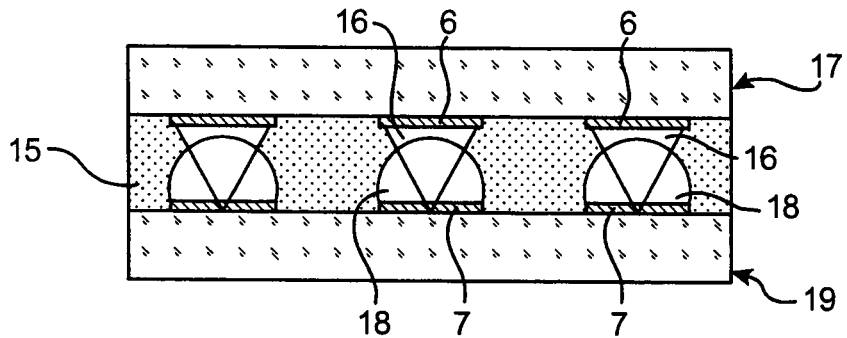
FIG. 1 illustrates a method of the prior art.
Figure 2A:
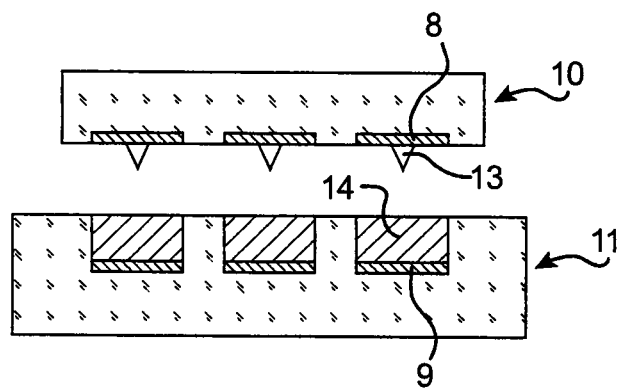
FIGS. 2A and 2B illustrate the formation of a connection by insertion of a series of points in the buried bumps according to the method of the invention.
Figure 2B:
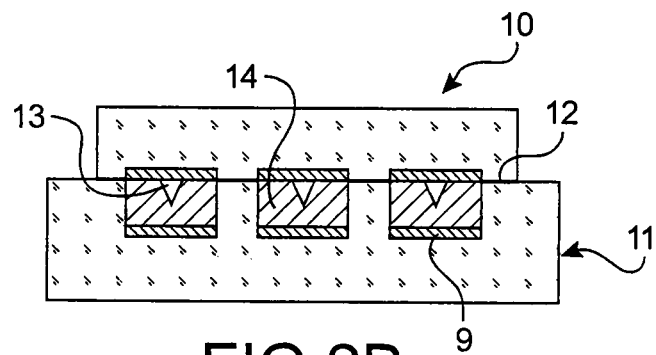

The method of the invention is a method of electrical connection of pads using the "flip chip" technique without flux.
In the method of the invention one carries out this connection between the pads 8 of a first component 10 and the pads 9 of a second component 11, for example a substrate, by insertion of a series of hard conductive points 13 arranged on one face of said first component 10 in a series of buried ductile conductive bumps 14 arranged on one face of the second component, as illustrated in FIGS. 2A and 2B.

The electrical connections are formed by insertion of hard conductive points in the buried ductile conductive bumps. One may thereby transfer directly one component onto the other, for example a chip onto a substrate. The mechanical holding is assured by a bonding at the interface 12 between the bumps. It involves for example a traditional bonding or a sealing by molecular adhesion, carried out at ambient temperature by means of a plasma activation. Since the part in which one inserts the point is buried, one carries out a direct sealing of the two components and one eliminates the coating step of the prior art.

Moreover, since the mechanical holding takes place no longer by the connections but by the surface between the components, it is no longer necessary to heat. The hybridisation can be carried out at ambient temperature. Indeed, if the points are sufficiently sharpened and the material of the bumps sufficiently ductile, the insertion may be carried out uniquely by application of a mechanical pressure.

Such an insertion may be carried out by playing on the Young's moduli of the respective materials constituting the points 13 and the bumps 14, and/or on the shape of the points 13. Indeed, the higher the ratio of the Young's moduli between the two materials, the easier the insertion. One may therefore choose any pair of conductor materials: for example a point in metal or in any material covered with a metallic layer and a bump in soldering paste (In, SnPb, AuSn, etc.). In the same way, the sharper the shape of the point, the less pressure has to be applied. The points 13 have to be sufficiently hard and thin (for example angle at the summit less than 30°, ratio between the 2 Young's moduli greater than 10) in order to be able to pierce the crust of oxide and push into the bumps 14 with a minimum mechanical pressure.

The sealing by molecular adhesion with SAB ("Surface Activated Bonding") surface activation, envisaged above for the bonding between the two components, has the following advantages.

The direct transfer of one component onto another by a sealing by molecular adhesion at ambient temperature is possible. There is therefore no offset of the facing pads during the hybridisation. Until then, sealing by molecular adhesion could not be envisaged in "flip chip" technology due to the fact of the high temperature thermal treatment (1000° C.) that was necessary to strengthen the bonds. Thanks to the activation of surfaces by SAB ("Surface Activated Bonding") plasma, one is now capable of carrying out sealing at ambient temperature.

Sealing by "conventional" molecular adhesion (in other words without surface activation) consists in bringing into contact two materials at ambient temperature after physical-chemical treatment of their surface, then by carrying out a high temperature thermal treatment in order to strengthen the crystalline structure by creation of atomic bonds.

Plasma activation makes it possible to carry out a physical-chemical cleaning of the surfaces on the atomic scale by bombardment with excited particles. Bonds break at the surface and hanging bonds are created. The surfaces are then sufficiently reactive so that the quality of sealing obtained at ambient temperature is mechanically acceptable and that a strengthening by thermal treatment is not indispensable. The hybridisation may thereby be carried out at ambient temperature. One avoids the problems of offset of pads during hot hybridisations (due to the difference in the thermal expansion coefficient of the chip and the substrate).

One may also carry out the transfer by any other sealing method: polymer bonding, eutectic sealing, soldering, etc.

Formation of the Buried Bumps

The buried ductile bumps may be formed for example by electrolytic growth at the base of the cavities formed in a passivation layer. The passivation layer may be of $SiO_2$ and the caissons may be in indium or aluminium.

Figure 3A:
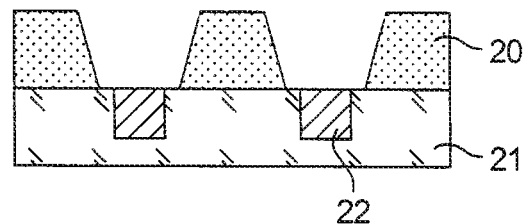
FIGS. 3A to 7C illustrate several embodiments of the method of the invention.
Figure 3B:
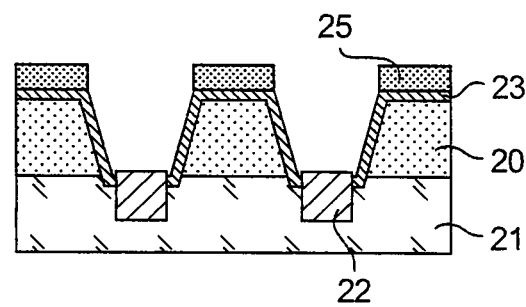
Figure 3C:
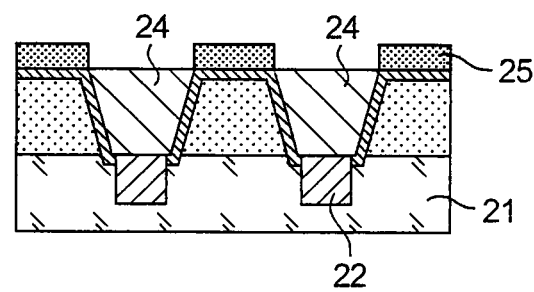
Figure 3D:
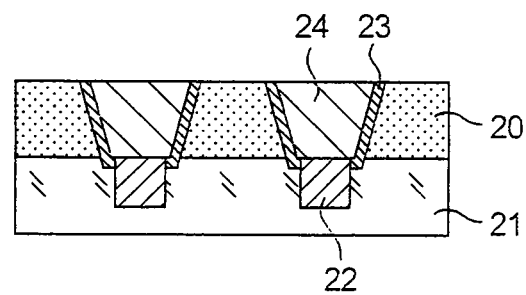

One may have, therefore, the following steps:
a step of deposition of a passivation layer 20 (for example $SiO_2$) on a substrate 21 equipped with pads 22 then a step of chemical etching (FIG. 3A),
a step of deposition of a continuous base in Ti 23 (FIG. 3B),
a step of deposition of a mask in resin 25,
a step of electrolytic growth for example of indium 24 (FIG. 3C) or any other ductile conductor material,
a step of selective chemical etching of the continuous base (FIG. 3D) and the resin.

Formation of Points

The series of points may be obtained in several ways, for example by metallic deposition, etching, electrolytic growth, electrodeposition method ("electroless"), metallic nanoprinting or growth of aligned carbon nanotubes, etc.

1) Metallic Deposition

A first technique consists in carrying out a deposition of metal by sputtering above the cavities of resin. As the deposition proceeds, the opening is obstructed and the quantity of metal deposited at the cavity base diminishes. The shape thereby obtained at the cavity base becomes conical.

Figure 4A:
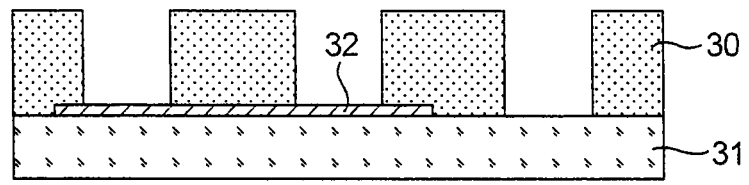
Figure 4B:
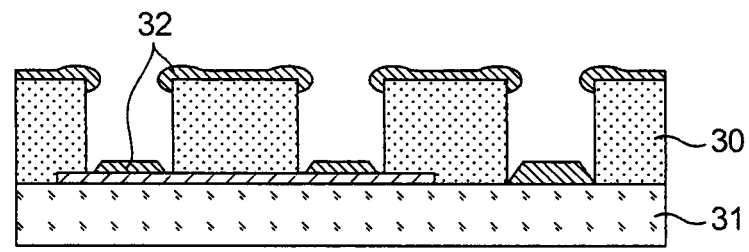
Figure 4C:
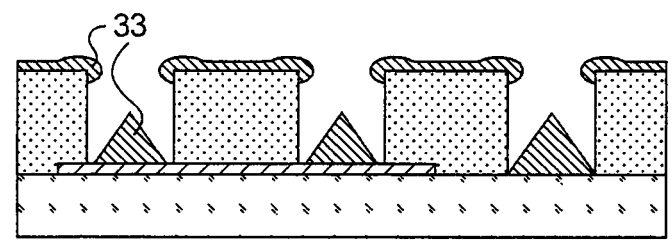
Figure 4D:
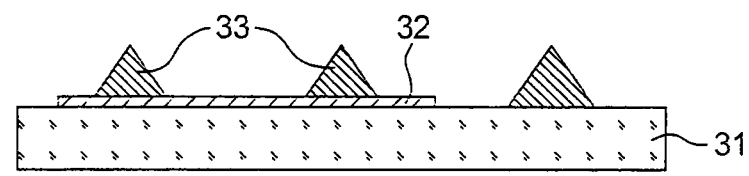

One therefore has the following steps:
a step of deposition of a mask of resin 30 by "lift-off" on a substrate 31 equipped with pads 32 (FIG. 4A),
a step of deposition of a metal 33 (FIGS. 4B and 4C),
a step of removal of the resin (FIG. 4D).

A second technique consists in carrying out the deposition step over the whole wafer, depositing a mask in resin then etching the metal by chemical etching.

2) Electrolytic Growth

One may also carry out an electrolytic growth of a metal at the base of a cavity of resin in which the sides are oblique. This obliqueness may be obtained for example by means of a double resining. One thereby deposits two types of resin that do not have the same sensitivity to exposure. Once exposed, they do not dissolve in the same way.

Figure 5A:
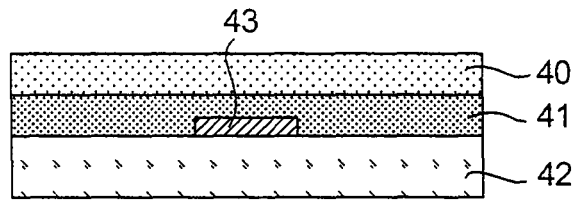
Figure 5B:
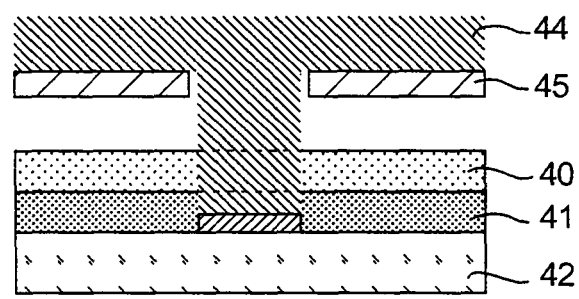
Figure 5C:
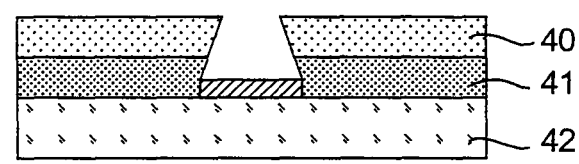
Figure 5D:
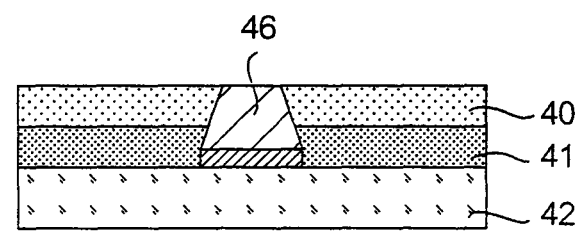
Figure 5E:
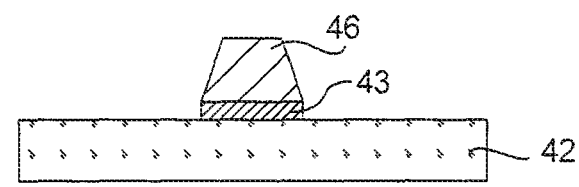

One therefore has the following steps:
- a step of double resining by deposition of two resins 40 and 41 on a substrate 42 equipped with pads 43 (FIG. 5A),
- a step of exposure to ultraviolet radiation 44 under a mask 45 (FIG. 5B),
- a step of dilution of the exposed resins (FIG. 5C),
- a step of electrolytic deposition of the material 46 constituting the points (FIG. 5D),
- a step of removal of the two resins 40 and 41 (FIG. 5E).

3) Metallic Nanoprinting

Originally, the technique of nanoprinting was used to mould polymers, but moulding alloys may also be envisaged providing they are heated to around the melting temperature. It is necessary to choose alloys of low melting point.

Figure 6A:
Figure 6A:
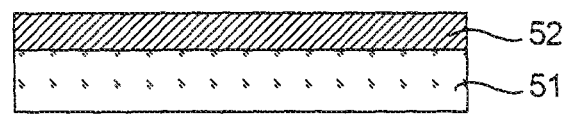
Figure 6B:
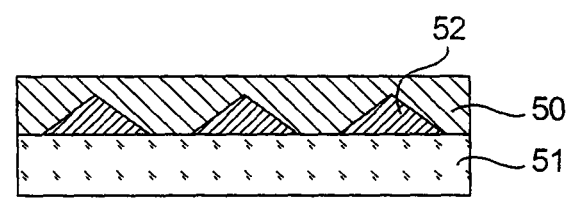
Figure 6C:
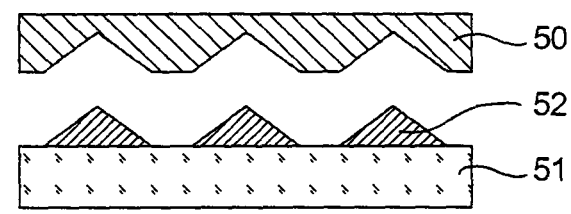
Figure 6D:
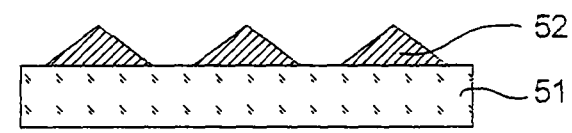

One thus has the following steps:
- a step of stamping a mould 50 on a substrate 51 on which is conventionally deposited a layer of alloy 52, (FIGS. 6A and 6B),
- a step of removing the mould (FIGS. 6C and 6D).

The mould patterns may be formed in several ways: one may use a mould, in silicon for example, and form pyramidal holes by anistropic chemical attack (KOH) along the crystalline planes. One may also form the mould by hot stamping. The material must be sufficiently resistant thermally and mechanically so as not to cleave under the application of a force.

4) Growth of Points in Carbon Nanotubes.

One can grow nanotubes under an electrical field in order to orient them. This technique is described in the article entitled "Patterned Selective Growth Of Carbon Nanotubes And Large Field Emission From Vertically Well-Aligned Carbon Nanotube Field Emitter Arrays" by Jung-Inn Sohn et al., *Applied Physics Letters*, Vol. 78(7), pps 901-903, Dec. 2, 2001. Indeed, this document envisages the direct growth of networks of carbon nanotubes vertically aligned on substrates in flexible plastic by using a chemical vapour deposition.

Figure 7A:
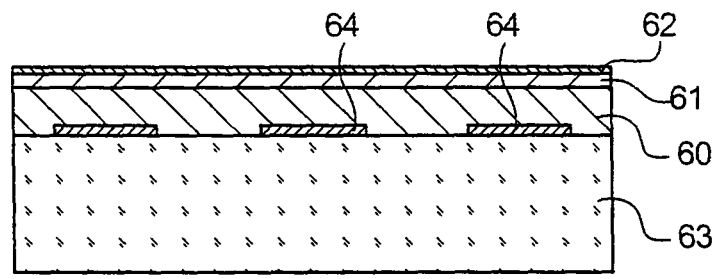
Figure 7B:
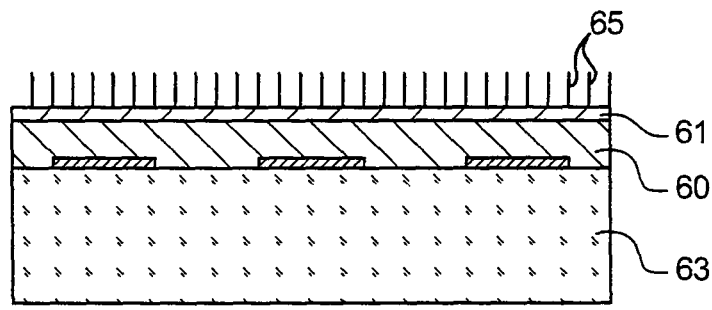

One thus has the following steps:
- a step of deposition of TiN 60, deposition of Ni 61 and deposition of catalyst 62 on a substrate 63 equipped with pads 64 (FIG. 7A),
- a step of forming droplets of the catalyst and of growing the nanotubes 65 at 450° C. (FIG. 7B).

Figure 7C:
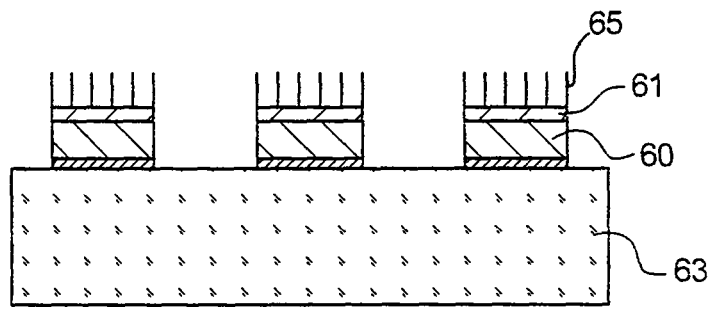

Advantageously, these nanotubes can grow locally by means of a masking method during the deposition of the different layers necessary for their elaboration (FIG. 7C).

The invention claimed is:

1. Method of electrical connection between a series of hard conductive sharpened points with an angle at the summit less than 30° and corresponding pads arranged on one face of a first component, and a series of buried ductile conductive bumps and corresponding pads arranged on one face of a second component, a ratio of the Young's moduli between the series of hard conductive sharpened points and the series of buried ductile conductive bumps being greater than 10, the method comprising:
   - forming said series of hard conductive sharpened points on said face of the first component;
   - forming said series of buried ductile conductive bumps on said face of the second component;
   - electrically connecting the pads of the first component and the pads of the second component by inserting said series of hard conductive sharpened points in said series of buried ductile conductive bumps at an ambient temperature without heating the buried ductile conductive bumps; and
   - realizing a mechanical holding between the two components by direct bonding the first and the second components together without applying heat to the buried ductile conductive bumps.

2. Method according to claim 1, in which a mechanical holding between the first and second components is assured by a bonding at the interface between the two components, and between the buried ductile conductive bumps.

3. Method according to claim 2, in which the bonding is a sealing by molecular adhesion carried out at the ambient temperature, with no heating, by means of a plasma activation.

4. Method according to claim 1, in which the buried ductile conductive bumps are obtained by electrolytic growth at the base of cavities formed in a passivation layer.

5. Method according to claim 3, further comprising:
   - depositing a passivation layer on a substrate equipped with pads, wherein chemical etching is applied to the substrate;
   - depositing a continuous base in a conductor material;
   - applying a mask to at least a portion of the continuous base to define the bumps;
   - forming electrolytic growth of a ductile material in the bumps;
   - selectively chemical etching to remove the mask and the continuous base from the passivation layer.

6. Method according to claim 1, in which the hard conductive sharpened points are obtained by metallic deposition, etching, electrolytic growth, metallic nanoprinting, or growth of aligned nanotubes.

7. A method comprising:
   - forming a plurality of hard conductive sharpened points with an angle at the summit less than 30° protruding from corresponding pads on a first face of a first component;
   - forming a plurality of buried ductile conductive areas arranged on a second face of a second component, the buried ductile conductive areas disposed on corresponding pads arranged within the second component, wherein the first component and the second component are oriented such that the hard conductive sharpened points and the buried ductile conductive areas face one another, a ratio of the Young's moduli between the hard conductive sharpened points and the buried ductile conductive areas being greater than 10;
   - electrically connecting the corresponding pads of the first component and the pads of the second component by inserting the plurality of hard conductive sharpened points into the corresponding buried ductile conductive areas while the buried ductile conductive areas are at an ambient temperature and without heating; and
   - realizing a mechanical holding between the two components by direct bonding the first and the second components together without applying heat to the buried ductile conductive areas.

8. A method comprising:
   - forming a plurality of hard conductive sharpened points with an angle at the summit less than 30° protruding from corresponding pads on a first face of a first component;
   - forming a plurality of buried ductile conductive areas arranged on a second face of a second component, the buried ductile conductive areas disposed on corresponding pads arranged within the second component, wherein the first component and the second component are oriented such that the hard conductive sharpened points and the buried ductile conductive areas face one another, a ratio of the Young's moduli between the hard conductive sharpened points and the buried ductile conductive areas being greater than 10; applying plasma activation to the hard conductive sharpened points and the buried ductile conductive areas to allow subsequent sealing of the hard conductive sharpened points to the buried ductile conductive areas at an ambient temperature;

electrically connecting the pads of the first component and the pads of the second component by inserting the plurality of hard conductive sharpened points into the corresponding buried ductile conductive areas; and realizing a mechanical holding between the two components by direct bonding the first and second components together without heating the ductile conductive areas.

* * * * *

UNITED STATES PATENT AND TRADEMARK OFFICE
CERTIFICATE OF CORRECTION

PATENT NO.        : 8,586,409 B2                              Page 1 of 1
APPLICATION NO.   : 11/662940
DATED             : November 19, 2013
INVENTOR(S)       : Davoine et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 586 days.

Signed and Sealed this

Twenty-second Day of September, 2015

Michelle K. Lee
*Director of the United States Patent and Trademark Office*